(12) United States Patent
Okamoto

(10) Patent No.: US 6,392,214 B1
(45) Date of Patent: May 21, 2002

(54) OPTICAL UNIT PHOTOELECTRIC SWITCH FIBER-TYPE PHOTOELECTRIC SWITCH AND COLOR DISCRIMINATION SENSOR

(75) Inventor: Yasuhiro Okamoto, Osaka (JP)

(73) Assignee: Keyence Corporation, Osaka (JP)

( * ) Notice: Subject to any disclaimer, the term of this patent is extended or adjusted under 35 U.S.C. 154(b) by 0 days.

(21) Appl. No.: 09/310,333

(22) Filed: May 12, 1999

(30) Foreign Application Priority Data

May 13, 1998 (JP) ................................................ 130833

(51) Int. Cl.⁷ .................................................. G01J 1/32
(52) U.S. Cl. ........................................ 250/205; 250/226
(58) Field of Search .............................. 250/205, 226, 250/216, 227.14, 227.18, 234

(56) References Cited

U.S. PATENT DOCUMENTS

| | | | |
|---|---|---|---|
| 4,449,821 A | 5/1984 | Lee | 356/319 |
| 4,812,641 A | 3/1989 | Ortiz, Jr. | 250/205 |
| 5,029,245 A | 7/1991 | Keranen et al. | 250/205 |
| 5,303,037 A | 4/1994 | Taranowski | 356/406 |
| 5,471,052 A | 11/1995 | Ryczek | 250/226 |

FOREIGN PATENT DOCUMENTS

DE  41 33 131 C 1  2/1993

*Primary Examiner*—Que T. Le
(74) *Attorney, Agent, or Firm*—Morgan, Lewis & Bockius LLP

(57) ABSTRACT

A photoelectric switch which has a light source made up of elements 1a, 1b, and 1c for emitting light, a projection lens 3, a first optical fiber 6a for guiding the light emitted from the light source and penetrating the projection lens into a detection position 7, a detection light reception element 2a, a second optical fiber 6b for guiding the light reflected from the detection position 7 or the light penetrating the detection position 7 into the detection light reception element 2a, and a monitor light reception element 2b disposed at a position for receiving light between the projection lens 3 and the incident end part of the first optical fiber 6a. According to the present invention, it is possible to provide a photoelectric switch capable of precisely monitoring the light transmission quantity if the transmissivity or reflectivity of an optical system changes.

12 Claims, 5 Drawing Sheets

OPTICAL UNIT PHOTOELECTRIC SWITCH FIBER-TYPE PHOTOELECTRIC SWITCH AND COLOR DISCRIMINATION SENSOR

BACKGROUND OF THE INVENTION

This invention relates to an optical unit, a photoelectric switch, and a fiber-type photoelectric switch each comprising a plurality of light emission elements or light reception elements, and a color discrimination sensor for detecting color of an object.

Hitherto, an optical unit such as a photoelectric switch has been used for emitting light to an object and receiving the light reflected from the object or the light penetrating through the object, thereby detecting information on the object. With the photoelectric switch, light is emitted to a transport passage of an object and the presence or absence, the shape, the dimensions, the color, etc., of the object can be detected on the basis of the light reception quantity of the reflected light or penetrated light.

Such a photoelectric switch comprises a light transmission section for transmitting light to a detection position and a light reception section for receiving the light reflected from the detection position or the light penetrating the detection position. With the photoelectric switch of reflection type, when an object exists at the detection position, light transmitted from the light transmission section is reflected from the object and the reflected light is received at the light reception section. On the other hand, with the photoelectric switch of penetration type, when an object does not exist at the detection position, light transmitted from the light transmission section is received at the light reception section. Therefore, whether or not the object exists can be determined on the basis of the light reception quantity level in the light reception section.

A color discrimination sensor, which is also a kind of photoelectric switch, comprises a light transmission section containing a light source consisting of three light emission elements for respectively generating light having wavelength bands corresponding to Red, Green and Blue and a projection lens for transmitting light emitted from each light emission element to an object and a light reception section having a detection light reception element for receiving light reflected from the object.

Light emitted from each of the three light emission elements is transmitted through the projection lens to the object in order and reflected light is received on the detection light reception element, then the color of the object can be determined on the basis of the light reception quantity level of each color, for example, from comparison with reference color.

In an optical unit such as a photoelectric switch having such a light transmission section, the light quantity of each light emission element changes due to ambient temperature change or light emission element variation with time, and there is a fear of erroneous detection. Thus, it becomes necessary to monitor the light quantity of each light emission element, and a monitor light reception element to monitor the light emission element is placed near the light emission element. Change in the light quantity of the light emission element is sensed based on an output signal of the monitor light reception element and feedback control of the light emission element can be performed so that the light quantity of the light emission element becomes constant.

Although the light quantity of the light emission element is controlled constant, however, if the transmissivity or the reflectivity of each of the optical members such as a half mirror and a dichroic mirror contained in an optical system for guiding light emitted from the light emission element into a projection lens changes due to ambient temperature change or light emission wavelength change of the light emission element, the light transmission quantity to a detection position will change.

To avoid this, a method of using a material having an unchanged transmissivity or reflectivity as shown in an optical unit in a related art shown in FIG. 11 is suggested. For example, light emitted from a light emission element 41a penetrates dichroic mirrors 44 and 46 and a glass plate 47 and is transmitted through a projection lens 43 to an object. Light from a light emission element 41b is reflected by the dichroic mirror 44, penetrates the dichroic mirrors 46 and the glass plate 47, and is transmitted through the projection lens 43 to the object. Light from a light emission element 41c is reflected by the dichroic mirror 46, penetrates the glass plate 47, and is transmitted through the projection lens 43 to the object.

A reflected light of the light incident on the glass plate 47 is received on a monitor light reception element 42. Since the glass plate 47 is formed of a material having a transmissivity or reflectivity unchanged depending on temperature or light wavelength, the light transmission quantity to the object can be monitored continuously if the ambient temperature changes or the light emission element 41a, 41b, 41c, etc., varies with time.

However, in the example in the related art, the optical unit in FIG. 11 requires use of an optical member having a transmissivity or reflectivity unchanged depending on temperature or light wavelength in the optical system. Since the glass plate 47 formed as such an optical member has a low reflectivity, the light quantity of the light emission element. 41a, 41b, 41c needs to be increased to provide the light reception quantity of the monitor light reception element 42. Resultantly, the light emission elements 41a, 41b, and 41c are upsized, and the glass plate 47 formed as the optical member having a transmissivity or reflectivity unchanged depending on temperature or light wavelength is provided, resulting in upsizing the unit and an increase in costs.

If the transmissivity or reflectivity of the projection lens 43 varies with temperature or light wavelength, the light transmission quantity to the object cannot be monitored precisely.

SUMMARY OF THE INVENTION

It is therefore an object of the invention to provide an optical unit, a photoelectric switch, a fiber type photoelectric switch, and a color discrimination sensor capable of precisely monitoring the light transmission quantity to an object if the transmissivity or reflectivity of a member changes.

To the end, according to a first aspect of the invention, there is provided an optical unit for transmitting light to a predetermined position, comprising a light source for emitting light, a projection lens for transmitting light emitted from the light source to the predetermined position, and a monitor light reception element disposed at a position for receiving the light emitted from the light source and penetrating the projection lens.

According to the configuration, the monitor light reception element is disposed at the position for receiving the light emitted from the light source and penetrating the projection lens. Thus, if the transmissivity or reflectivity of an optical member contained in the optical system from the light source to the projection lens or the projection lens changes with temperature or light wavelength, the light transmission quantity to the predetermined position can be monitored precisely.

In the first aspect of the invention, it is preferable that the optical unit further includes control means for controlling the light quantity of the light source based on the light reception quantity of the monitor light reception element.

According to the configuration, the light transmission quantity can be fed back based on the light reception quantity of the monitor light reception element.

In the first aspect of the invention, it is also advantageous that the optical unit further includes control means for outputting an output signal based on the light reception quantity of the monitor light reception element.

According to the configuration, the outside party can be informed that the light transmission quantity lowers by the output signal based on the light reception quantity of the monitor light reception element.

According to a second aspect of the invention, there is provided a photoelectric switch for transmitting light to a detection position and receiving light reflected from the detection position or light penetrating the detection position, the photoelectric switch comprising a light source for emitting light, a projection lens for transmitting light emitted from the light source to the detection position, a detection light reception element for receiving light reflected from the detection position or light penetrating the detection position, and a monitor light reception element disposed at a position for receiving the light emitted from the light source and penetrating the projection lens.

According to the configuration of the photoelectric switch, the monitor light reception element is disposed at the position for receiving the light emitted from the light source and penetrating the projection lens. Thus, if the transmissivity or reflectivity of an optical member contained in the optical system from the light source to the projection lens or the projection lens changes with temperature or light wavelength, the light transmission quantity to the detection position can be monitored precisely.

In the second aspect of the invention, it is preferable that the photoelectric switch further includes control means for controlling the light quantity of the light source based on the light reception quantity of the monitor light reception element.

According to the configuration of the photoelectric switch, feedback control of the light transmission quantity can be performed based on the light reception quantity of the monitor light reception element. In addition, in the second aspect of the present invention, it is advantageous that the photoelectric switch further includes control means for correcting an output signal of the detection light reception element based on the light reception quantity of the monitor light reception element.

According to the configuration of the photoelectric switch, the output signal of the detection light reception element is corrected in response to change in the light reception quantity of the monitor light reception element, whereby erroneous detection caused by lowering of the light transmission quantity can be prevented.

According to a third aspect of the invention, there is provided a fiber type photoelectric switch for transmitting light to a detection position and receiving light reflected from the detection position or light penetrating the detection position, the fiber type photoelectric switch comprising a light source for emitting light, a projection lens for transmitting light emitted from the light source to the detection position, a first optical fiber for guiding the light emitted from the light source and penetrating the projection lens into the detection position, a detection light reception element, a second optical fiber for guiding the light reflected from the detection position or the light penetrating the detection position into the detection light reception element, and a monitor light reception element disposed at a position for receiving light between the projection lens and the incident end part of the first optical fiber.

According to the configuration of the fiber type photoelectric switch, the monitor light reception element is disposed at the position for receiving light between the projection lens and the incident end part of the first optical fiber. Thus, if the transmissivity or reflectivity of an optical member contained in the optical system from the light source to the projection lens or the projection lens changes with temperature or light wavelength, the light transmission quantity to the detection position can be monitored precisely.

According to a fourth aspect of the invention, there is provided a color discrimination sensor for transmitting light to an object and detecting color of the object based on light reflected from the object, the color discrimination sensor comprising a plurality of light emission elements for emitting light in different wavelength bands, a projection lens for transmitting light emitted from the light emission elements to the object, a detection light reception element for receiving the light reflected from the object, and a monitor light reception element disposed at a position for receiving the light emitted from the light emission elements and penetrating the projection lens.

According to the configuration of the color discrimination sensor, the monitor light reception element is disposed at the position for receiving the light emitted from the light emission elements and penetrating the projection lens. Thus, if the transmissivity or reflectivity of an optical member contained in the optical system from each light emission element to the projection lens or the projection lens changes with temperature or light wavelength, the light transmission quantity to the object can be monitored precisely.

In the fourth aspect of the present invention, it is advantageous that the light emission elements are placed in the ascending order of detection light reception element output values corresponding to light emitted from the light emission elements to the projection lens.

According to the configuration, the light emission element corresponding to the lowest level of light reception element output is placed nearest to the projection lens, whereby light attenuation caused by the two dichroic mirrors can be avoided for relatively raising the output level.

DETAILED DESCRIPTION OF THE PREFERRED EMBODIMENTS

Referring now to the accompanying drawings, there are shown preferred embodiments of the invention.

A first embodiment of the invention will be discussed.

Figure 1:
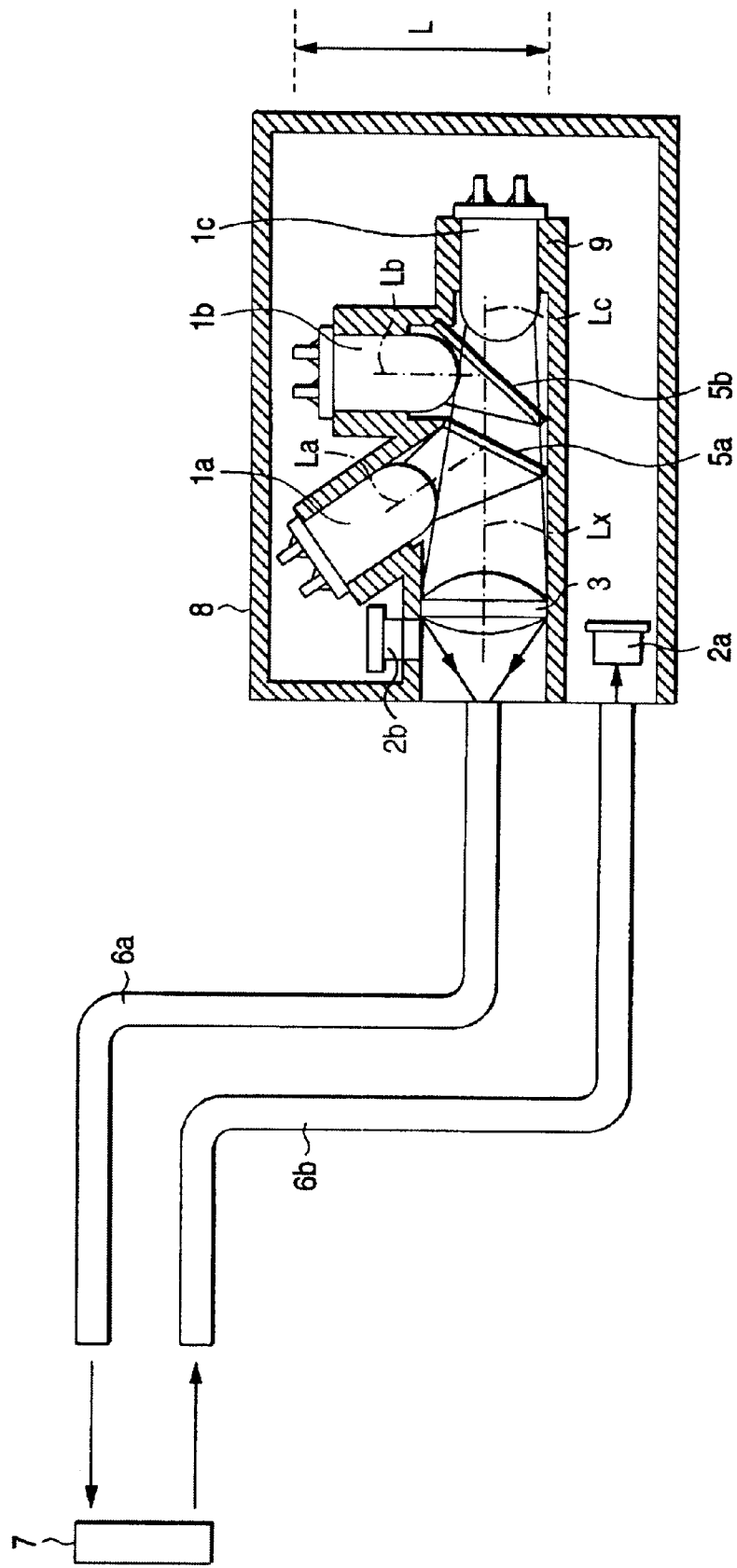
FIG. 1 is a sectional view of the main part of a fiber type photoelectric switch according to the first embodiment of the invention.

FIG. 1 is a sectional view of the main part of a fiber type photoelectric switch according to the first embodiment of the invention.

The photoelectric switch shown in FIG. 1 can also be used as a color discrimination sensor. It comprises a housing 8, a holder 9 placed in the housing 8, three light emission elements 1a, 1b, and 1c, a monitor light reception element 2b, a projection lens 3, and two dichroic mirrors 5a and 5b disposed in the holder 9, a detection light reception element 2a below the holder 9, and a pair of optical fibers 6a and 6b attached to the front of the housing 8.

The light emission elements 1a, 1b, and 1c are, for example, light emitting diodes and emit light of different wavelength bands. For example, the light emission element 1a emits green light (that is, a light having a range of wavelength corresponding to green), the light emission element 1b emits blue light (that is, a light having a range of wavelength corresponding to blue), and the light emission element 1c emits red light (that is, a light having a range of wavelength corresponding to red). The light emission element 1c is placed so that an optical axis Lc of the light emission element 1c matches an optical axis Lx of the projection lens 3. The light emission element 1b is placed so that an optical axis Lb of the light emission element 1b crosses the optical axis Lx of the projection lens 3 at right angles. The light emission element 1a is placed so that an optical axis La of the light emission element 1a crosses the optical axis Lx of the projection lens 3 at an angle of greater than 0 degrees and smaller than 90 degrees.

Each of the dichroic mirrors 5a and 5b reflects light of a specific wavelength band and allows light of any other wavelength to pass through. In the embodiment, the dichroic mirror 5a reflects light of the light emission wavelength of the light emission element 1a and allows light of any other wavelength to pass through. The dichroic mirror 5b reflects light of the light emission wavelength of the light emission element 1b and allows light of any other wavelength to pass through.

The dichroic mirror 5b is placed so as to allow light emitted from the light emission element 1c to pass through and guide the light into the projection lens 3 and reflect light emitted from the light emission element 1b and guide the light into the projection lens 3. The dichroic mirror 5a is placed so as to allow light penetrating the dichroic mirror 5b from the light emission element 1c and light reflected on the dichroic mirror 5b from the light emission element 1b to pass through and guide the light into the projection lens 3 and reflect light emitted from the light emission element 1a and guide the light into the projection lens 3.

The light emission elements 1a, 1b, and 1c, the projection lens 3, and the dichroic mirrors 5a and 5b are placed so that the total of the optical path length from the light emission element 1a to the dichroic mirror 5a and the optical path length from the dichroic mirror 5a to the projection lens 3, the total of the optical path length from the light emission element 1b to the dichroic mirror 5b and the optical path length from the dichroic mirror 5b to the projection lens 3, and the optical path length from the light emission element 1c to the projection lens 3 substantially match.

As shown in FIG. 1, the projection lens 3 is placed so as to gather light from the light emission elements 1a, 1b, and 1c at one end of the optical fiber 6a.

The detection light reception element 2a and the monitor light reception element 2b are made each of a photodiode, for example. The detection light reception element 2a is placed so as to face one end of the optical fiber 6b. The monitor light reception element 2b is placed at a position for receiving light between the projection lens 3 and one end of the optical fiber.

The placement order of the light emission elements 1a, 1b, and 1c is determined by the light emission power of the light emission elements and the spectral sensitivity of a photodiode used as the light reception element 2a, as parameters. The determination method of the placement order will be discussed.

Figure 2:
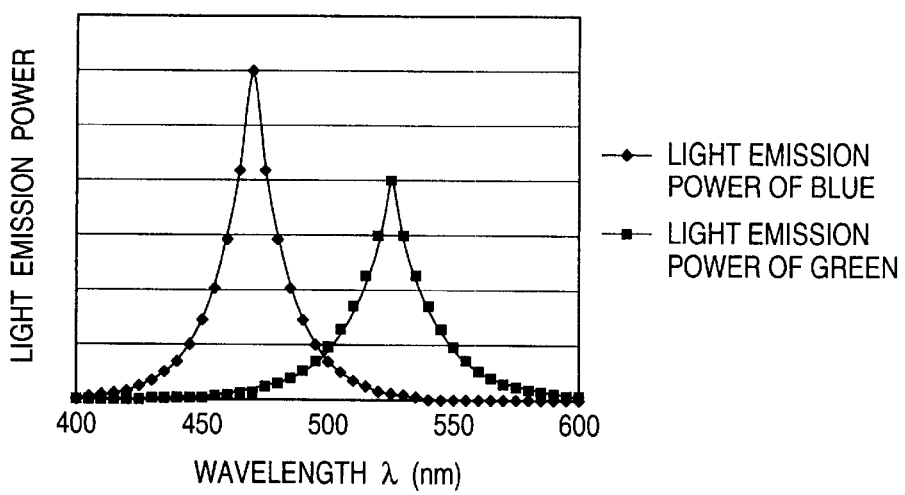
FIG. 2 is a graph to show the light emission power of light emission elements shown in FIG. 1.

The light emission power of the light emission element 1 generally has a distribution characteristic responsive to the wavelength as shown in FIG. 2 which shows the relationship between the wavelength and light emission power, and luminescent color can be recognized visually from the wavelength distribution of the light emission power. For example, in FIG. 2, light emitted from the blue light emission element (with the light emission power having the peak 470 nm and distributed in the range of 400 nm to 550 nm) can be recognized as blue and light emitted from the green light emission element (with the light emission power having the peak 525 nm and distributed in the range of 450 nm to 600 nm) can be recognized as green. Although the light emission power of the red light emission element is not shown, it has a peak at a point near 700 nm.

Figure 3:
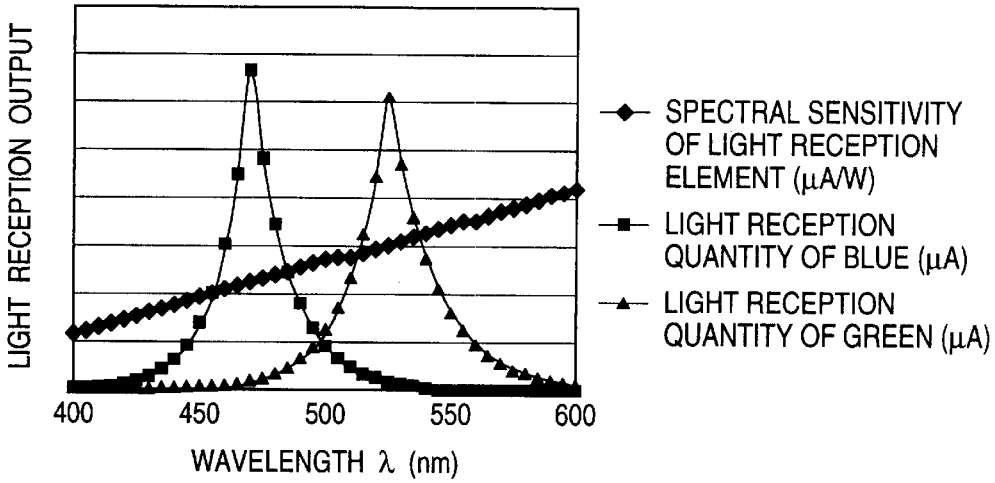
FIG. 3 is a graph to show output of a light reception element shown in FIG. 1.

To use such light emission elements 1 as a light source of a light discrimination sensor, etc., a photodiode or a phototransistor is used as the light reception element 2a; it changes in sensitivity depending on the wavelength of incident light. Generally, the silicon family photodiode or phototransistor has the highest sensitivity in the range of 800 nm to 1000 nm in the infrared area, namely, unvisual wavelength band; the sensitivity lowers in any other wavelength range. FIG. 3 shows an example of the spectral sensitivity of the light reception element rising toward 800 nm from left to right.

To use the light emission elements 1 and the light reception element 2a actually to form a color discrimination sensor, etc., the level of a detection signal that can be taken out as light reception element output is determined by the relationship between the wavelength distribution of the light emission power of the light emission elements 1 and the spectral sensitivity difference depending on the wavelength of the light reception element 2a. In other words, to use the light emission elements 1a, 1b, and 1c different in light emission wavelength, from the relationship between the light emission power and the sensitivity difference of the light reception element 2a for each wavelength, the light reception element output corresponding to one color light emission element differs from the light reception element output corresponding to another and there is the light emission element causing the signal level of the light reception element output to reach the minimum.

Specifically, the signal levels can be compared, for example, as follows:

The light emission power depending on each of the wavelengths of the light emission elements 1a, 1b, and 1c is represented as wavelength function In ($\lambda$) (n=1, 2, 3):

$$1a = I_1(\lambda)$$

$$1b = I_2(\lambda)$$

$$1c = I_3(\lambda)$$

where $\lambda$: Light emission wavelength.

The spectral sensitivity for each wavelength of the light reception element 2a is represented as $$p(\lambda)$$

The light reception output corresponding to each light emission element of the wavelength band, namely, the output signal level of the light reception element, Ln (N=1, 2, 3), is found as follows:

$$L_1 = \int I_1(\lambda) \cdot p(\lambda) d\lambda$$

$$L_2 = \int I_2(\lambda) \cdot p(\lambda) d\lambda$$

$$L_3 = \int I_3(\lambda) \cdot p(\lambda) d\lambda$$

where $L_1$: Light reception output of light emission element 1a;

$L_2$: Light reception output of light emission element 1b; and $L_3$: Light reception output of light emission element 1c.

The light reception output is found by integrating the product of the light emission power of the light emission element and the spectral sensitivity of the light reception element with respect to the wavelength ($\lambda$). That is, it is found by integrating the light reception quantity shown in FIG. 4 relative to the light reception element.

By comparing $L_1$, $L_2$, and $L_3$ thus found, which of the light emission elements has the lowest signal level as light reception element output can be checked.

Next, a specific example will be discussed wherein the above-described comparison method is used to indicate which of the light emission element for emitting green band light, which will be hereinafter referred to as the green LED, and the light emission element for emitting blue band light, which will be hereinafter referred to as the blue LED, has a lower signal level as light reception element output.

Examples of the numeric values of the green and blue LEDs thus found are described in a table below.

TABLE

| wavelength | spectral sensitivity | | light reception output | | luminosity | brightness | |
|---|---|---|---|---|---|---|---|
| | B | G | PD | B*PD | G*PD | factor | b | g |
| 400 | 0.041 | 0.002 | 0.118 | 0.005 | 0.000 | 0.000 | 0.000 | 0.000 |
| 405 | 0.058 | 0.002 | 0.125 | 0.007 | 0.000 | 0.001 | 0.000 | 0.000 |
| 410 | 0.083 | 0.003 | 0.133 | 0.011 | 0.000 | 0.001 | 0.000 | 0.000 |
| 415 | 0.119 | 0.004 | 0.140 | 0.017 | 0.000 | 0.003 | 0.000 | 0.000 |
| 420 | 0.169 | 0.005 | 0.148 | 0.025 | 0.001 | 0.004 | 0.001 | 0.000 |
| 425 | 0.242 | 0.006 | 0.155 | 0.038 | 0.001 | 0.008 | 0.002 | 0.000 |
| 430 | 0.346 | 0.008 | 0.163 | 0.058 | 0.001 | 0.012 | 0.004 | 0.000 |
| 435 | 0.494 | 0.011 | 0.170 | 0.084 | 0.002 | 0.017 | 0.009 | 0.000 |
| 440 | 0.706 | 0.015 | 0.178 | 0.125 | 0.003 | 0.023 | 0.016 | 0.000 |
| 445 | 1.008 | 0.020 | 0.185 | 0.187 | 0.004 | 0.031 | 0.031 | 0.001 |
| 450 | 1.441 | 0.027 | 0.193 | 0.277 | 0.005 | 0.038 | 0.055 | 0.001 |
| 455 | 2.058 | 0.036 | 0.200 | 0.412 | 0.007 | 0.049 | 0.101 | 0.002 |
| 460 | 2.940 | 0.048 | 0.208 | 0.610 | 0.010 | 0.060 | 0.176 | 0.003 |
| 465 | 4.200 | 0.063 | 0.215 | 0.903 | 0.014 | 0.076 | 0.317 | 0.005 |
| 470 | 6.000 | 0.084 | 0.223 | 1.335 | 0.019 | 0.091 | 0.546 | 0.008 |
| 475 | 4.200 | 0.113 | 0.230 | 0.966 | 0.026 | 0.115 | 0.483 | 0.013 |
| 480 | 2.940 | 0.150 | 0.238 | 0.698 | 0.036 | 0.139 | 0.409 | 0.021 |
| 485 | 2.058 | 0.200 | 0.245 | 0.504 | 0.049 | 0.174 | 0.357 | 0.035 |
| 490 | 1.441 | 0.267 | 0.253 | 0.364 | 0.067 | 0.208 | 0.300 | 0.050 |
| 495 | 1.008 | 0.356 | 0.260 | 0.262 | 0.093 | 0.266 | 0.268 | 0.095 |
| 500 | 0.706 | 0.475 | 0.268 | 0.189 | 0.127 | 0.323 | 0.228 | 0.153 |
| 505 | 0.494 | 0.633 | 0.275 | 0.136 | 0.174 | 0.413 | 0.204 | 0.261 |
| 510 | 0.346 | 0.844 | 0.283 | 0.098 | 0.238 | 0.503 | 0.174 | 0.424 |
| 515 | 0.242 | 1.125 | 0.290 | 0.070 | 0.326 | 0.607 | 0.147 | 0.682 |
| 520 | 0.169 | 1.500 | 0.298 | 0.050 | 0.446 | 0.710 | 0.120 | 1.065 |
| 525 | 0.119 | 2.000 | 0.305 | 0.036 | 0.610 | 0.786 | 0.093 | 1.572 |
| 530 | 0.083 | 1.500 | 0.313 | 0.026 | 0.469 | 0.862 | 0.072 | 1.293 |
| 535 | 0.058 | 1.125 | 0.320 | 0.019 | 0.360 | 0.908 | 0.053 | 1.022 |
| 540 | 0.041 | 0.844 | 0.328 | 0.013 | 0.276 | 0.954 | 0.039 | 0.805 |
| 545 | 0.028 | 0.633 | 0.335 | 0.010 | 0.212 | 0.975 | 0.028 | 0.617 |
| 550 | 0.020 | 0.475 | 0.343 | 0.007 | 0.163 | 0.995 | 0.020 | 0.472 |
| 555 | 0.014 | 0.356 | 0.350 | 0.005 | 0.125 | 0.995 | 0.014 | 0.354 |
| 560 | 0.010 | 0.267 | 0.358 | 0.003 | 0.095 | 0.995 | 0.010 | 0.266 |
| 565 | 0.007 | 0.200 | 0.365 | 0.002 | 0.073 | 0.974 | 0.007 | 0.195 |
| 570 | 0.005 | 0.150 | 0.373 | 0.002 | 0.056 | 0.952 | 0.005 | 0.143 |
| 575 | 0.003 | 0.113 | 0.380 | 0.001 | 0.043 | 0.911 | 0.003 | 0.103 |
| 580 | 0.002 | 0.084 | 0.388 | 0.001 | 0.033 | 0.870 | 0.002 | 0.073 |
| 585 | 0.002 | 0.063 | 0.395 | 0.001 | 0.025 | 0.814 | 0.001 | 0.052 |
| 590 | 0.001 | 0.048 | 0.403 | 0.000 | 0.019 | 0.757 | 0.001 | 0.036 |
| 595 | 0.001 | 0.036 | 0.410 | 0.000 | 0.015 | 0.694 | 0.001 | 0.025 |
| 600 | 0.001 | 0.027 | 0.418 | 0.000 | 0.011 | 0.631 | 0.000 | 0.017 |
| 605 | 0.000 | 0.020 | 0.425 | 0.000 | 0.009 | 0.567 | 0.000 | 0.011 |
| 610 | 0.000 | 0.015 | 0.433 | 0.000 | 0.007 | 0.503 | 0.000 | 0.008 |
| 615 | 0.000 | 0.011 | 0.440 | 0.000 | 0.005 | 0.442 | 0.000 | 0.005 |
| 620 | 0.000 | 0.008 | 0.448 | 0.000 | 0.004 | 0.381 | 0.000 | 0.003 |
| 625 | 0.000 | 0.006 | 0.455 | 0.000 | 0.003 | 0.323 | 0.000 | 0.002 |
| 630 | 0.000 | 0.005 | 0.463 | 0.000 | 0.002 | 0.265 | 0.000 | 0.001 |
| 635 | 0.000 | 0.004 | 0.470 | 0.000 | 0.002 | 0.220 | 0.000 | 0.001 |
| 640 | 0.000 | 0.003 | 0.478 | 0.000 | 0.001 | 0.175 | 0.000 | 0.000 |
| 645 | 0.000 | 0.002 | 0.485 | 0.000 | 0.001 | 0.141 | 0.000 | 0.000 |
| 650 | 0.000 | 0.002 | 0.493 | 0.000 | 0.001 | 0.107 | 0.000 | 0.000 |

The first column of the table indicates the wavelengths of light in 5-nm steps of 400 nm to 650 nm. The second column indicates the light emission power B of the blue LED, the third column indicates the light emission power G of the green LED, the fourth column indicates the spectral sensitivity PD of the light reception element, the fifth column indicates light reception element output when the blue LED emits light B*PD (product of light emission power B of the blue LED and spectral sensitivity PD), and the sixth indicates light reception element output when the green LED emits light G*PD (product of light emission power G of the green LED and spectral sensitivity PD).

To show the relationships between the wavelengths and the light emission power at the blue and green LEDs, FIG. 2 is provided by plotting the numeric values under the second and third columns of the above-mentioned Table.

Next, to show the spectral sensitivity of the light reception element relative to the wavelengths and the relationships between the wavelengths corresponding to light emission outputs of the blue and green LEDs and light reception output of the light reception element, FIG. 3 is provided by plotting the numeric values of the spectral sensitivity of the light reception element under the fourth column of the above-mentioned Table, the numeric values of output of the light reception element indicated under the fifth column (product of light emission power of the blue LED and spectral sensitivity of the light reception element), and the numeric values of output of the light reception element indicated under the sixth column (product of light emission power of the green LED and spectral sensitivity of the light reception element).

Referring to the above-mentioned numeric Table, the integral value of the light reception element output of the green LED ($L_1=\int I_1(\lambda) \cdot p(\lambda) \, d\lambda$) is compared with the integral value of the light reception element output of the blue LED ($L_2=\int I_2(\lambda) \cdot p(\lambda) d\lambda$) in the wavelength range of 400 nm to 650 nm in 5-nm steps. In the above-mentioned Table, the sum total (possibly, representing the integral value) of the light reception element output of the green LED is smaller than that of the blue LED. Therefore, it is understood that the integral value of the light reception element output corresponding to the blue LED is greater than that corresponding to the green LED and that the level of the light reception element output corresponding to the blue LED becomes higher.

A comparison with the level of the light reception element output corresponding to the red LED can also be made by a similar method. However, the level of the light reception element output corresponding to the red LED will not be discussed in detail, because it is clear that the level of the light reception element output corresponding to the red LED becomes larger than that corresponding to the blue or green LED as generally a light reception element of a silicon-family photodiode, phototransistor, etc., has a spectral sensitivity rising from left to right with a peak in the area of 800 nm or more and the red LED has the light emission output peak near 700 nm.

Figure 4:
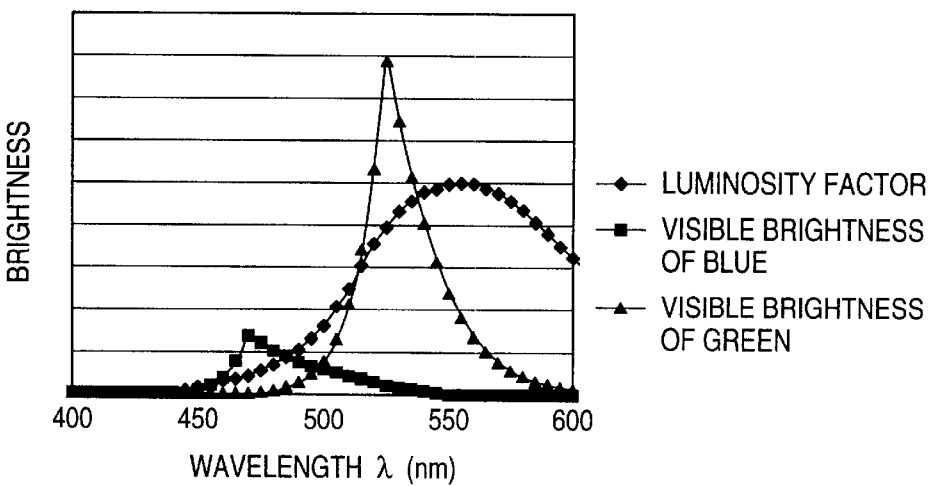
FIG. 4 is a graph to show brightness according to luminosity factor shown in FIG. 3.

Further, to show the relationships among the luminosity factor of a human being relative to the wavelengths, visible brightness of light emission output of the blue LED, and visible brightness of light emission output of the green LED, FIG. 4 is provided by plotting the numeric values listed under the seventh to ninth columns of the Table.

As shown in FIG. 4 and the Table, the brightness of the light emission element of each color according to the luminosity factor observed with human being eyes can be found by the product of the light emission power of each LED and luminosity factor. In the Table, the sum total of the brightness of the green LED in the wavelength range of 400 nm to 650 nm in 5-nm steps is larger than that of the brightness of the blue LED. Therefore, the visible brightness of the light emission output of the blue LED becomes considerably smaller than that of the green LED.

A comparison with the visible brightness of the light emission output of the red LED can also be made by a similar method.

As seen from the description made so far, the visible brightness of the light emission output of the green LED becomes a higher level than that of the blue LED, but the actual light reception output of the light reception element corresponding to the green LED becomes smaller than that corresponding to the blue LED.

The inventor considers the placement order of the light emission elements of the whole optical unit based on the knowledge. That is, the optical system is designed by assigning the highest priority to the light emission element which becomes the lowest level when the light reception outputs corresponding to the light sources of the wavelengths, namely, the output signal levels of the light reception element are compared. In other words, light is emitted from each light source and is received at the light reception element under the same condition and the light source having the smallest output signal level is assigned the highest priority for designing the optical system.

Specifically, as shown in FIG. 1, the green LED 1a whose light reception element output level is the lowest is disposed optically and physically nearest to the projection lens 3, the blue LED 1b whose light reception element output level is the second lowest is disposed next to the green LED 1a, and the red LED 1c whose light reception element output level is the highest is disposed most distant from the projection lens 3. The reason why the LEDs are thus placed is that while light from the red LED 1c arrives at the projection lens 3, it is attenuated twice as it penetrates the dichroic mirror 5b and the dichroic mirror 5a and that while light from the blue LED 1b arrives at the projection lens 3, it is attenuated twice as it is reflected on the dichroic mirror 5b and penetrates the dichroic mirror 5a, but while light from the green LED 1a arrives at the projection lens 3, it is attenuated only once as it is only reflected on the dichroic mirror 5a.

Although placement of the light emitting diodes can be thus determined by making reference to the light reception element output in FIG. 3 and the Table, the calculation value data varies with the elements and drive conditions and is not constant. The order of red, green, and blue changes depending on the characteristics of the elements. Although blue B and green G have been examined, red R can also be examined likewise.

According to such placement, light emitted from the light emission element causing the output at the light reception element to reach the minimum level is made to skip penetration of the dichroic mirrors 5a and 5b for lessening the attenuation degree of the output, so that the incident light quantity on the light reception element can be raised relatively for adjusting the level of the corresponding color light reception element output.

The optical fiber 6a transmits light gathered at one end through the projection lens 3 to the other end and guides the light into a detection position 7 and the optical fiber 6b transmits light reflected from the detection position 7 and incident on one end to the other end and guides the light into the detection light reception element 2a, whereby if the distance from the photoelectric switch to the detection position 7 is longer than the tolerance that can be detected in the configuration using the LEDs, the optical fibers 6a and 6b enable light transmission and detection.

The light emission elements 1a, 1b, and 1c are turned on in order in a time division way. If the light emission element 1a is turned on, green light emitted from the light emission element 1a is reflected on the dichroic mirror 5a and is guided through the projection lens 3 and the optical fiber 6a into the detection position. If the light emission element 1b is turned on, blue light emitted from the light emission element 1b is reflected on the dichroic mirror 5b, penetrates the dichroic mirror 5a, and is guided through the projection lens 3 and the optical fiber 6a into the detection position. If the light emission element 1c is turned on, red light emitted from the light emission element 1c penetrates the dichroic mirrors 5b and 5a and is guided through the projection lens 3 and the optical fiber 6a into the detection position. If an object 7 exists at the detection position, reflected light from the object 7 is guided through the optical fiber 6b into the detection light reception element 2a. Color of the object 7 can be detected according to color detection based on the color light reception quantities of green, blue, and red, light reception quantity percentage of R, G, and B, etc., in addition to shape and position detection of the object (workpiece) 7 based on reflected light and penetrating light received at the detection light reception element 2a.

Change can also be made whenever necessary so that the object (workpiece) 7 can be detected according to penetrating light received at the detection light reception element 2a by placing the optical fiber 2b on the light reception side in FIG. 1 on the opposite side to the object 7.

Thus, with the photoelectric switch, etc., according to the embodiment, light penetrating the projection lens 3 is received at the monitor light reception element 2b. Thus, if the transmissivity or reflectivity of the dichroic mirror 5a or 5b or the projection lens 3 changes with temperature or light wavelength, the light transmission quantity to the detection position can be monitored precisely. Therefore, a material having a transmissivity or reflectivity unchanged depending on temperature or light wavelength need not be selected for the dichroic mirror 5a or 5b or the projection lens 3; costs can be reduced.

Figure 5:
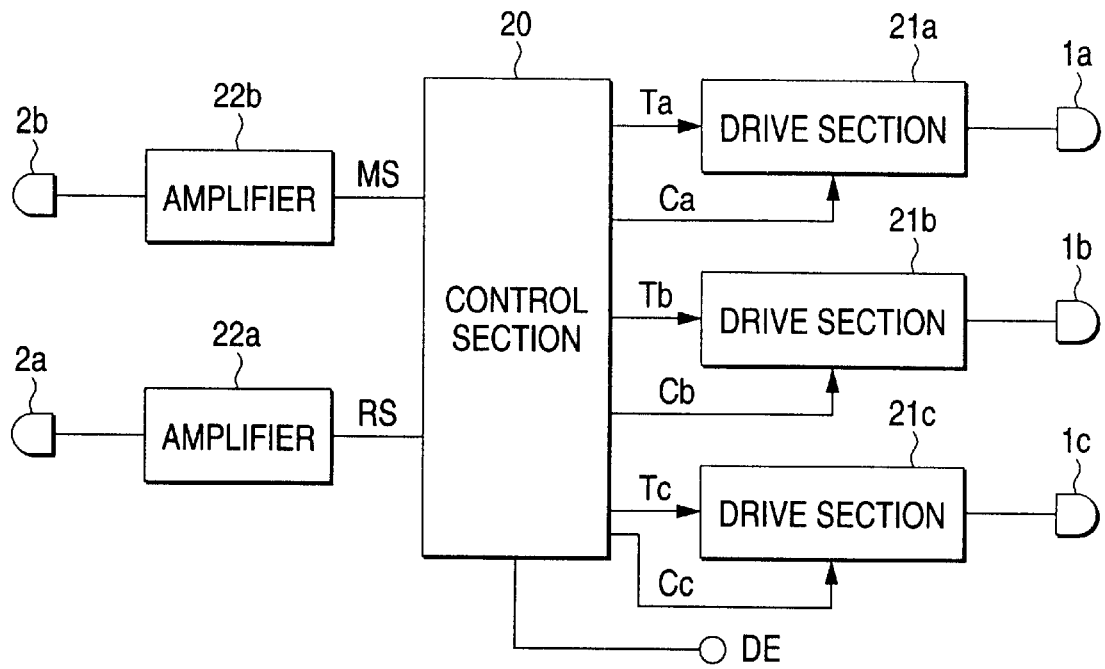
FIG. 5 is a block diagram to show a control system of the photoelectric switch shown in FIG. 1.

FIG. 5 is a block diagram of a control system of the photoelectric switch shown in FIG. 1.

In FIG. 5, a control section 20 gives light emission timing control signals Ta, Tb, and Tc for controlling the light emission timings of the light emission elements 1a, 1b, and 1c to drive sections 21a, 21b, and 21c respectively. The drive sections 21a, 21b, and 21c respond to the light emission timing control signals Ta, Tb, and Tc with driving of the light emission elements 1a, 1b, and 1c respectively.

An output signal of the detection light reception element 2a is amplified by an amplifier 22a and is given to the control section 20 as a light reception signal RS. The control section 20 outputs a detection signal DE based on the level of the light reception signal RS. For example, if the level of the light reception signal RS is higher than a predetermined threshold value, the control section 20 outputs the detection signal DE high; if the level of the light reception signal RS is lower than the predetermined threshold value, the control section 20 outputs the detection signal DE low.

An output signal of the monitor light reception element 2b is amplified by an amplifier 22b and is given to the control section 20 as a monitor signal MS. The control section 20 gives light emission quantity control signals Ca, Cb, and Cc to the drive sections 21a, 21b, and 21c respectively based on the level of the monitor signal MS. The drive sections 21a, 21b, and 21c control drive currents supplied to the light emission elements 1a, 1b, and 1c based on the light emission quantity control signals Ca, Cb, and Cc respectively, thereby controlling the light emission quantities of the light emission elements 1a, 1b, and 1c so that the light transmission quantity to the detection position becomes constant.

Figure 6:
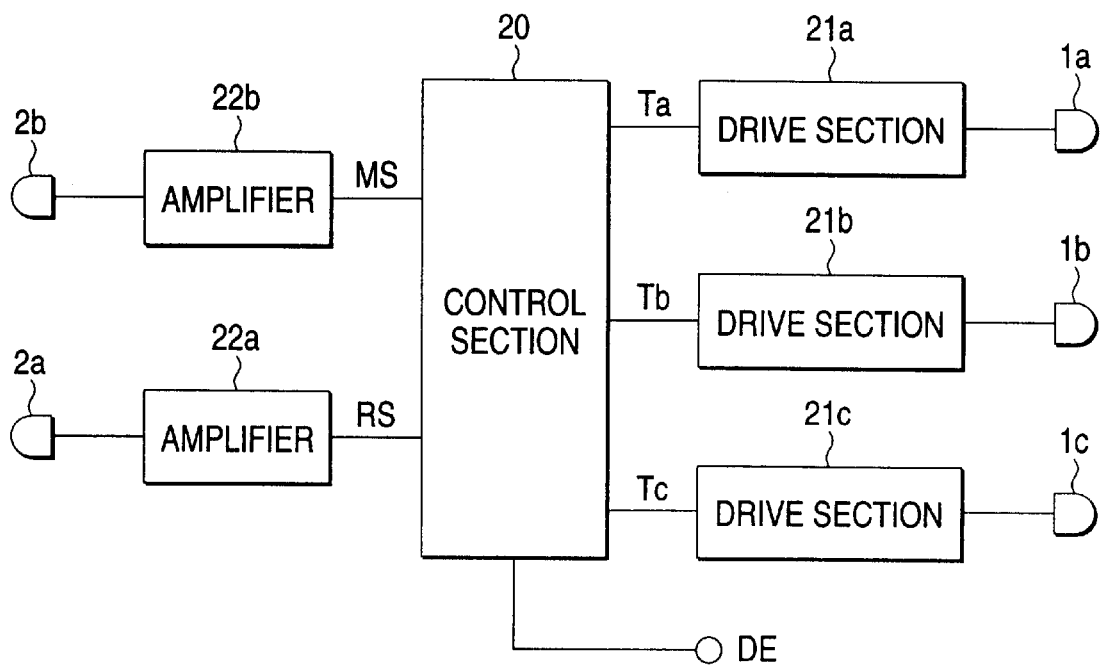
FIG. 6 is a block diagram to show another example of the control system shown in FIG. 5.

FIG. 6 is a block diagram of another embodiment of the control system of the photoelectric switch shown in FIG. 5.

In the example in FIG. 6, a control section 20a corrects the level of a light reception signal RS given from an amplifier 22a based on the level of a monitor signal MS given from an amplifier 22b. For example, if the level of the monitor signal MS lowers, the control section 20a raises the level of the light reception signal RS, so that erroneous detection caused by lowering of the light transmission quantity can be prevented. Other components of the control system in FIG. 6 are identical with those in FIG. 5 and will not be discussed again.

Next, a second embodiment of the invention will be discussed with reference to FIG. 7.

Figure 7:
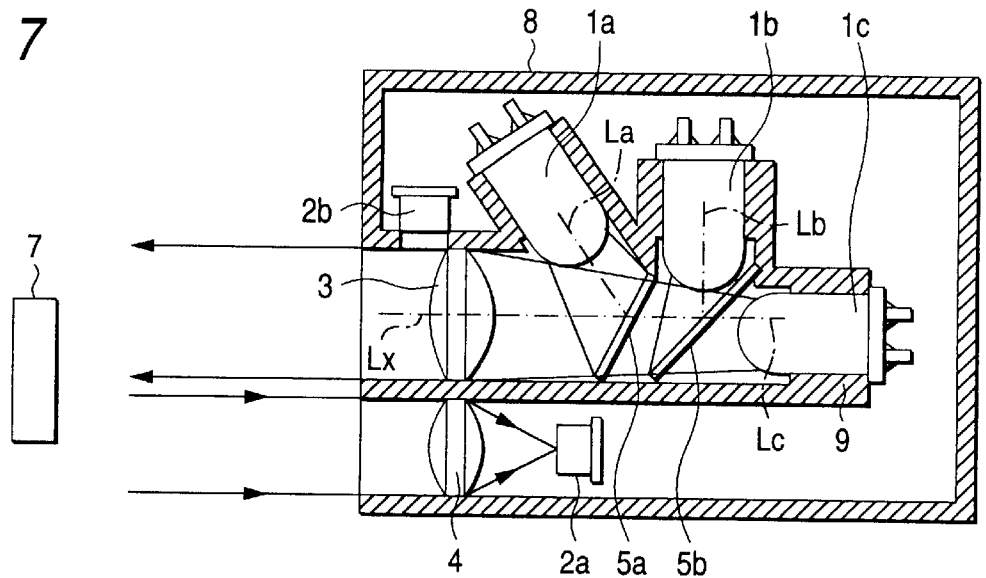
FIG. 7 is a sectional view of the main part of a photoelectric switch according to a second embodiment of the invention.

FIG. 7 is a sectional view of the main part of a photoelectric switch according to the second embodiment of the invention.

The photoelectric switch shown in FIG. 7 differs from the photoelectric switch in FIG. 1 in that it does not comprise optical fibers and is provided with a light reception lens 4.

A projection lens 3 transmits light from light emission elements 1a, 1b, and 1c to a detection position. The light reception lens 4 gathers light from the detection position at a detection light reception element 2a. If an object 7 exists at the detection position, reflected light from the object 7 is gathered through the light reception lens 4 at the detection light reception element 2a. A monitor light reception element 2b is placed at a position for receiving light penetrating the projection lens 3.

The configuration of a control system of the photoelectric switch shown in FIG. 7 may be the same as the configuration shown in FIGS. 5 or 6.

Also with the photoelectric switch of the embodiment, light penetrating the projection lens 3 is received at the monitor light reception element 2b. Thus, if the transmissivity or reflectivity of a dichroic mirror 5a or 5b or the projection lens 3 changes with temperature or light wavelength, the light transmission quantity to the detection position can be monitored precisely. Therefore, a material having a transmissivity or reflectivity unchanged depending on temperature or light wavelength need not be selected for the dichroic mirror 5a or 5b or the projection lens 3; costs can be reduced.

Next, a third embodiment of the invention will be discussed with reference to FIGS. 8, 9 and 10.

Figure 8:
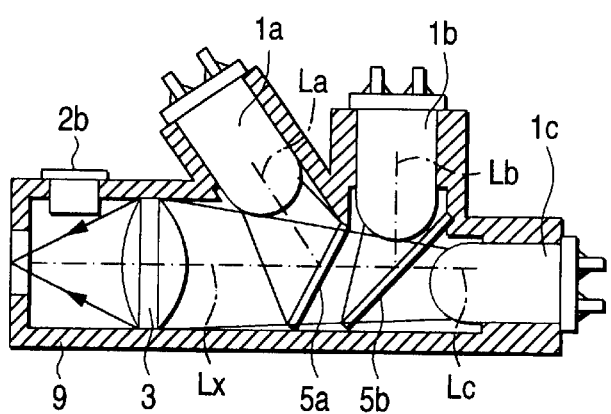
FIG. 8 is a sectional view of the main part of an optical unit according to a third embodiment of the invention.
Figure 9:
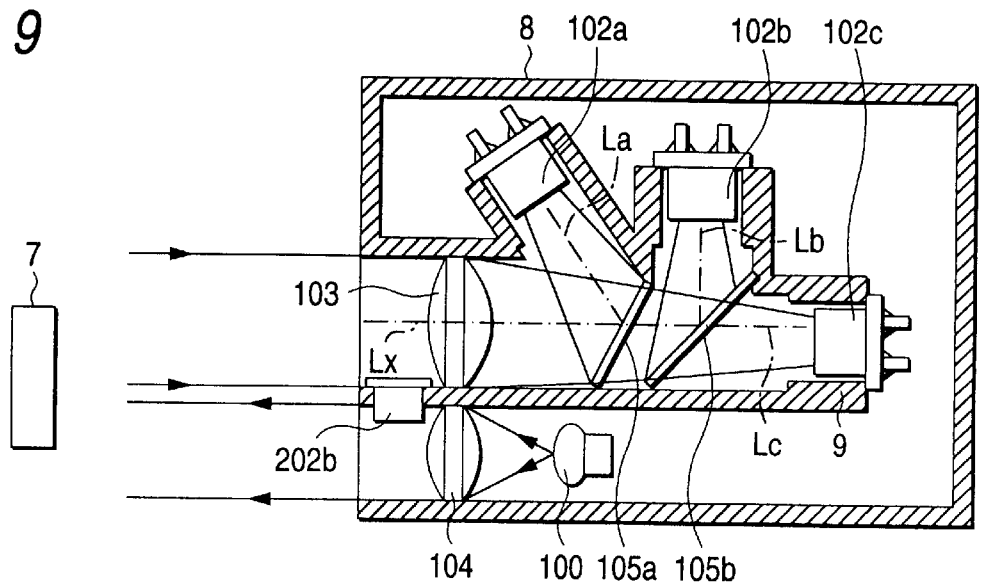
FIG. 9 is a sectional view of the main part of a modified example of the optical unit according to the third embodiment of the invention.

FIG. 8 is a sectional view of the main part of an optical unit according to the third embodiment of the invention.

As shown in FIG. 8, three light emission elements 1a, 1b, and 1c, a monitor light reception element 2b, a projection lens 3, and two dichroic mirrors 5a and 5b are disposed in a holder 9. The light emission elements 1a, 1b, and 1c, the dichroic mirrors 5a and 5b, and the projection lens 3 are placed as those of the photoelectric switch in FIG. 1. The monitor light reception element 2b is placed at a position for receiving light penetrating the projection lens 3.

First, light penetrating the projection lens 3 is received at the monitor light reception element 2b. Thus, if the transmissivity or reflectivity of the dichroic mirror 5a or 5b or the projection lens 3 changes with temperature or light wavelength, the light transmission quantity can be monitored precisely. Therefore, a material having a transmissivity or reflectivity unchanged depending on temperature or light wavelength need not be selected for the dichroic mirror 5a or 5b or the projection lens 3; costs can be reduced.

Figure 10:
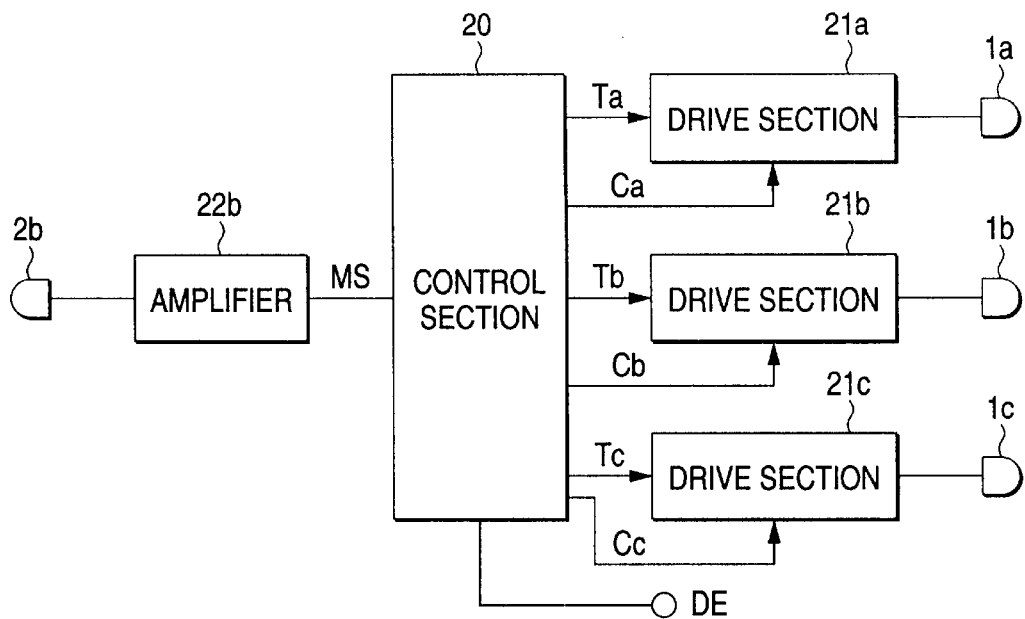
FIG. 10 is a block diagram to show a control system of the optical unit shown in FIG. 8.
Figure 11:
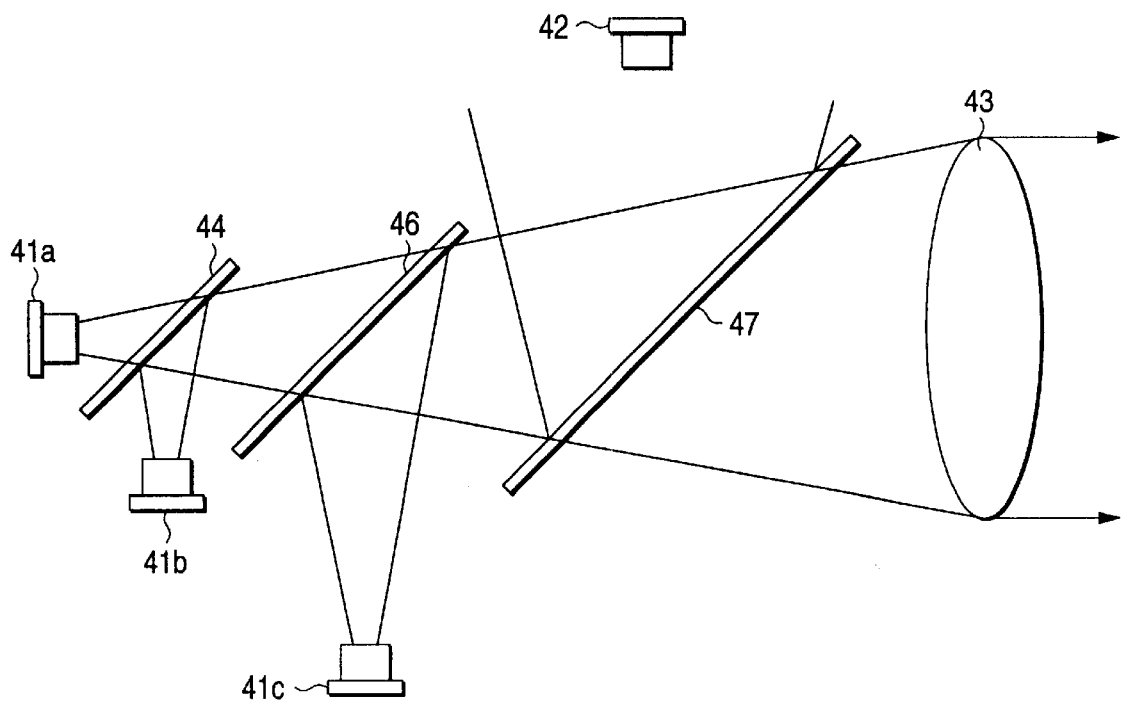
FIG. 11 is a schematic drawing to show an example of an optical unit in a related art.

FIG. 10 is a block diagram to show one example of a control system of the optical unit in FIG. 8.

In FIG. 10, a control section 20b gives light emission timing control signals Ta, Tb, and Tc for controlling the light emission timings of the light emission elements 1a, 1b, and 1c to drive sections 21a, 21b, and 21c respectively. The drive sections 21a, 21b, and 21c respond to the light emission timing control signals Ta, Tb, and Tc with driving of the light emission elements 1a, 1b, and 1c respectively.

An output signal of the monitor light reception element 2b is amplified by an amplifier 22b and is given to the control section 20b as a monitor signal MS. The control section 20b gives light emission quantity control signals Ca, Cb, and Cc to the drive sections 21a, 21b, and 21c respectively based on the level of the monitor signal MS. The drive sections 21a, 21b, and 21c control drive currents supplied to the light emission elements 1a, 1b, and 1c based on the light emission quantity control signals Ca, Cb, and Cc respectively, thereby controlling the light emission quantities of the light emission elements 1a, 1b, and 1c so that the light transmission quantity becomes constant.

The optical unit in FIG. 8 has been described as a light transmission unit, but the light emission elements 1a, 1b, and 1c can be all replaced with light reception elements, for example, to form a light reception unit. FIG. 9 shows a modified example of the optical unit for transmitting light of a white light (for example, a halogen lamp) 100 to an object 7 and receiving light reflected on the object 7 or light penetrating the object 7, thereby detecting information on the object 7. Green light G passing through a lens 103 is reflected on a dichroic mirror 105a and is received at a green light reception element 102a. Blue light B passing through the lens 103 passes through the dichroic mirror 105a, is reflected on a dichroic mirror 105b, and is received at a blue light reception element 102b. Red light R passing through the lens 103 passes through the dichroic mirrors 105a and 105b and is received at a red light reception element 102c.

The optical unit in FIG. 8 can be applied not only to photoelectric switches such as color discrimination sensors, but also to various optical units each having a light transmission section for transmitting light to a predetermined position.

The color discrimination sensors have been described as examples of the photoelectric switches, but the invention can also be applied to a photoelectric switch for detecting the presence or absence of an object at a detection position.

Although the dichroic mirrors are used as the optical members, other members of half mirrors, optical waveguides, etc., may be used as the optical members.

The light source is made up of the three light emission elements 1a, 1b, and 1c, but may be made up of one light emission element, two light emission elements, or four or more light emission elements.

Further, the projection lens 3 comprises one lens, but may be formed of more than one lens.

As described above, according to the invention, in the configuration of the optical unit, the photoelectric switch, the fiber type photoelectric switch, and the color discrimination sensor, the monitor light reception element is disposed at the position for receiving the light emitted from the light emission elements and penetrating the projection lens or at the position for receiving light between the projection lens and the incident end part of the first optical fiber. Thus, if the transmissivity or reflectivity of an optical member contained in the optical system from the light source to the projection lens or the projection lens changes with temperature or light wavelength, the light transmission quantity to the predetermined position can be monitored precisely.

An optical member or a projection lens having a transmissivity or reflectivity unchanged depending on temperature or light wavelength need not be used for the optical system; costs can also be reduced.

The present invention is based on Japanese Patent Application No. Hei 10-130833, which is incorporated herein by reference.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

What is claimed is:

1. An optical unit for transmitting light to a predetermined position, comprising:
   a light source for emitting light;
   a projection lens for transmitting a first portion of the light emitted from said light source directly to the predetermined position; and
   a monitor light reception element disposed at a position for monitoring the light emitted from said light source and transmitted through said projection lens.

2. The optical unit as claimed in claim 1, further comprising:
   control means for controlling a light quantity of said light source based on a light reception quantity of said monitor light reception element.

3. The optical unit as claimed in claim 1, further comprising:
   control means for outputting an output signal based on a light reception quantity of said monitor light reception element.

4. A photoelectric switch for transmitting light to a detection position and receiving light reflected from the detection position or light transmitted through the detection position, said photoelectric switch comprising:
   a light source for emitting light;
   a projection lens for transmitting light emitted from said light source directly to the detection position;
   a detection light reception element for receiving light reflected from the detection position or light transmitted through the detection position; and
   a monitor light reception element disposed at a position for monitoring the light emitted from said light source and transmitted through said projection lens.

5. The photoelectric switch as claimed in claim 4, further comprising:
   control means for controlling a light quantity of said light source based on a light reception quantity of said monitor light reception element.

6. The photoelectric switch as claimed in claim 4, further comprising:
   control means for correcting an output signal of said detection light reception element based on a light reception quantity of said monitor light reception element.

7. A fiber type photoelectric switch for transmitting light to a detection position and receiving light reflected from the detection position or light penetrating the detection position, said fiber type photoelectric switch comprising:
   a light source for emitting light;
   a projection lens for transmitting light emitted from said light source;
   a first optical fiber for guiding the light emitted from said projection lens to the detection position;
   a detection light reception element;
   a second optical fiber for guiding the light reflected from the detection position or the light transmitted through the detection position to said detection light reception element; and
   a monitor light reception element for monitoring light emitted from said light source and transmitted through said projection lens, said monitor light reception element being disposed at a position between said projection lens and an incident end part of said first optical fiber.

8. A color discrimination sensor for transmitting light to an object and detecting color of the object based on light reflected from the object, said color discrimination sensor comprising:
   a plurality of light emission elements for emitting light in different wavelength bands;
   a projection lens for transmitting light emitted from said plurality of light emission elements directly to the object;
   a detection light reception element for receiving the light reflected from the object; and a monitor light reception element disposed at a position for monitoring the light emitted from said plurality of light emission elements and transmitted through said projection lens.

9. The color discrimination sensor as claimed in claim 8, wherein said light emission elements are placed in the ascending order of detection light reception element output values corresponding to light emitted from said light emission elements to said projection lens.

10. The fiber type photoelectric switch as claimed in claim 7, wherein said projection lens converges the light emitted by said light source onto an end of said first optical fiber.

11. The fiber type photoelectric switch as claimed in claim 7, wherein said projection lens is disposed to lead the light emitted from said light source directly to said first optical fiber.

12. A photoelectric switch for transmitting light to a detection position and receiving light reflected from the detection position or light transmitted through the detection position, said photoelectric switch comprising:

a light source for emitting light;

a projection lens for collimating and transmitting light emitted from said light source to the detection position;

a detection light reception element for receiving light reflected from the detection position or light transmitted through the detection position; and a monitor light reception element disposed at a position for receiving the light emitted from said light source and transmitted through said projection lens.

* * * * *